United States Patent
Kuo et al.

(10) Patent No.: US 8,724,341 B2
(45) Date of Patent: May 13, 2014

(54) BACKPLANE AND BACKLIGHT MODULE

(75) Inventors: Yicheng Kuo, Shenzhen (CN); Yuchun Hsiao, Shenzhen (CN); Chong Huang, Shenzhen (CN); Jiahe Cheng, Shenzhen (CN); Chengwen Que, Shenzhen (CN); Quan Li, Shenzhen (CN); Liuyang Yang, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 229 days.

(21) Appl. No.: 13/376,183

(22) PCT Filed: Dec. 2, 2011

(86) PCT No.: PCT/CN2011/083332
§ 371 (c)(1),
(2), (4) Date: Dec. 3, 2011

(87) PCT Pub. No.: WO2013/071657
PCT Pub. Date: May 23, 2013

(65) Prior Publication Data
US 2013/0128490 A1    May 23, 2013

(30) Foreign Application Priority Data

Nov. 18, 2011  (CN) .......................... 2011 1 0369694

(51) Int. Cl.
*H05K 1/11*   (2006.01)
*H05K 1/14*   (2006.01)

(52) U.S. Cl.
USPC ........................................................ 361/788

(58) Field of Classification Search
None
See application file for complete search history.

(56) References Cited

U.S. PATENT DOCUMENTS

| | | | | |
|---|---|---|---|---|
| 4,603,377 A | * | 7/1986 | Kobayashi et al. | 361/832 |
| 4,860,369 A | * | 8/1989 | Koshimura et al. | 381/395 |
| 5,774,343 A | * | 6/1998 | Benson et al. | 361/796 |
| 5,847,923 A | * | 12/1998 | Lee | 361/679.4 |
| 6,662,609 B1 | * | 12/2003 | Janicek | 70/278.1 |
| 7,237,509 B2 | * | 7/2007 | Bonner et al. | 119/455 |

(Continued)

FOREIGN PATENT DOCUMENTS

| | | |
|---|---|---|
| CN | 2737129 Y | 10/2005 |
| CN | 101150942 Y | 3/2008 |

(Continued)

*Primary Examiner* — Jinhee Lee
*Assistant Examiner* — Xanthia C Cunningham
(74) *Attorney, Agent, or Firm* — IPro, Inc.; Na Xu (57) ABSTRACT

The present invention discloses a backplane and a backlight module. The backplane comprises a frame formed by a plurality of brackets, and bridges which are arranged on the brackets and used for fixing PCBs; the bridges can rotate relative to the fixed points of the bridges to the brackets; the bridges are provided with chutes or through holes used for installing hillocks. In the present invention, because the backplane is formed into a frame structure through a plurality of brackets, the manufacturing cost is lower and a large number of materials are saved. Simultaneously, the bridges can rotate relative to the fixed points of the bridges to the brackets, so that the positions of hillocks on the bridges can be adjusted to satisfy the needs of the PCBs of different dimensions and enhance the universality of the backplane. Further, the bridges are provided with chutes used for installing hillocks which can be installed in corresponding positions in the chutes as required; and then, the hillocks can obtain horizontal and vertical adjustment; therefore, the setting points of the hillocks are increased; the hillocks can adapt to PCBs of more dimensions and have preferable universality.

16 Claims, 7 Drawing Sheets

(56) References Cited

U.S. PATENT DOCUMENTS

| | | | |
|---|---|---|---|
| 7,304,856 B2* | 12/2007 | Andretta | 361/741 |
| 7,821,792 B2* | 10/2010 | Belady et al. | 361/735 |
| 7,848,115 B2* | 12/2010 | Casto et al. | 361/788 |
| 2006/0046532 A1* | 3/2006 | Hjort et al. | 439/74 |
| 2008/0180929 A1* | 7/2008 | Leigh et al. | 361/788 |
| 2010/0237029 A1* | 9/2010 | Cusson et al. | 211/41.1 |
| 2012/0224311 A1* | 9/2012 | Sutherland et al. | 361/679.01 |

FOREIGN PATENT DOCUMENTS

| | | |
|---|---|---|
| CN | 201115024 Y | 9/2008 |
| CN | 101644849 A | 2/2010 |
| CN | 201672468 U | 12/2010 |
| CN | 101937263 A | 1/2011 |
| CN | 201839534 U | 5/2011 |
| CN | 201845149 U | 5/2011 |
| CN | 202328043 U | 7/2012 |

* cited by examiner

BACKPLANE AND BACKLIGHT MODULE

TECHNICAL FIELD

The present invention relates to the field of liquid crystal displays (LCDs), and more particularly to a backplane and a backlight module.

BACKGROUND

Figure 1:
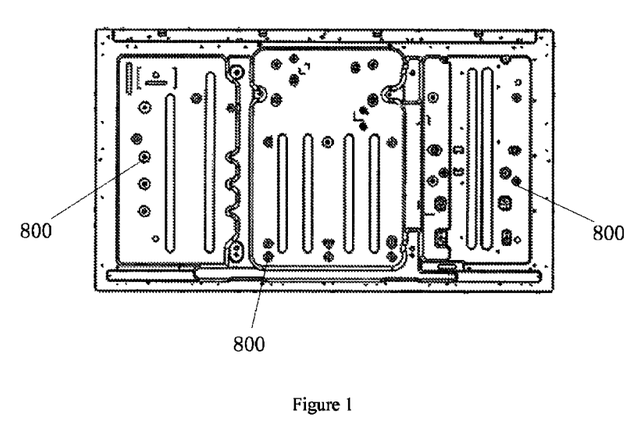
FIG. 1 is a structural diagram of an existing backplane.

Liquid crystal modules produced in batches adopt integral backplanes. Generally, the backplanes are integrally formed in a mode of metal stamping or plastic injection, causing heavier products and higher material cost of the products. A larger stamping equipment is needed for larger products, the cost is higher, the corresponding die dimension is very large, the structure is complicated, and the die cost is very high. FIG. 1 shows a structural diagram of an existing backplane; the backplane is formed by integrally stamping a whole metal; hillocks 80 used for fixing PCBs are stamped on the surface of the backplane; the backplane consumes a large number of materials and has larger weight and complicated processing courses. With increasingly fierce market competition, it is more and more important to effectively reduce the design cost. As a result, the key research direction of each designer lies in saving the material cost and simplifying the assembly technology. The design of hollow or joined backplane is developed on the existing design of the integral backplane; the cost is reduced to a certain extent; however, the strength of the joined or hollow backplane is reduced, so that it is difficult to originally fix PCBs on the backplane.

Hillocks are structures which are arranged on the backplane and used for fixing components such as PCBs and the like. Generally, the hillocks protrude from the surface of the backplane; the PCBs are fixed to the hillocks through screws or other locking pieces, so as to avoid short-circuiting caused by the direct contact of the PCBs with the surface of the backplane. For the existing backplane as shown in FIG. 1, the hillocks 80 on the backplane are integrally stamped and formed on the backplane in making the backplane; in this way, the positions of the hillocks 80 on the backplane are fixed and are difficult to adapt to the PCBs of different dimensions. At the same time, for PCBs of different dimensions and the backlight module with different needs for the number of components, the die needs to bemold-made again for making a corresponding backplane; in accordance with the PCBs of different dimensions, the die needs to be mold-made for making a new backplane, so that the universality is poor and the production cost is higher in such a case.

SUMMARY

The aim of the present invention is to provide a backplane with material saving property and good universality, and a backlight module.

The purpose of the present invention is achieved by the following technical schemes. A backplane comprises a frame formed by a plurality of brackets, and bridges which are arranged on the brackets and used for fixing PCBs; the bridges can rotate relative to the fixed points of the bridges to the brackets; the bridges are provided with chutes or through holes for installing hillocks.

Preferably, the bridges are arranged on two adjacent or opposite brackets in pairs; the fixed ends of the bridges are connected to the brackets through end hinges. Generally, the PCBs are locked through four angular points; thus, the bridges are arranged in pairs for corresponding to the angular points of the PCBs.

Preferably, the PCBs are supported through at least four bridges arranged on the brackets. At least four bridges are used for fixing the PCBs so that the PCBs are locked on the backplane more reliably.

Preferably, the free ends of the two bridges arranged in pairs are connected through tail hinges; the space between the hinging point of the free ends and the fixed point is adjustable. The bridges connected to the free ends can provide more steady support; simultaneously, the space between the hinging point of the free points and the fixed point of the fixed ends is adjustable, so as not to influence the selectivity of the bridges.

Preferably, the free ends of the two bridges arranged in pairs are provided with connecting grooves; the tail hinges penetrate through the connecting grooves of the two bridges; the tail hinges can slide in the connecting grooves. By installing the connecting grooves on the free ends, the tail hinges can slide in the connecting grooves so that the space between the hinging point of the free ends and the fixed point of the fixed ends is adjustable without influence on the rotation of the bridges.

Preferably, the free ends of the two bridges arranged in pairs are provided with connecting grooves; the fixed ends arranged in pairs are also provided with installing cross grooves; the end hinges and the tail hinges respectively slide in the connecting grooves and the installing cross grooves. Both ends are provided with grooves so that the hinges on both ends can slide in the grooves; therefore, the hillocks on the bridges can be adjusted in the horizontal direction and the vertical direction, so that the mobile zone of the hillocks is larger and the universality of the backplane is better.

Preferably, chutes of the two bridges extend to the end parts of the free ends; the tail hinges penetrate through the chutes. The extensions of the chutes are used for replacing the connecting grooves, so as to facilitate processing and increase production efficiency.

Preferably, chutes of the two bridges extend to the end parts of the free ends and the end parts of the fixed ends; the tail hinges penetrate through the chutes. The extensions of the chutes are used for replacing the connecting grooves and cross grooves, so as to facilitate processing and increase production efficiency.

Preferably, the bridges and the brackets are connected through screws. After the PCBs are locked, the screws are tightly locked so that the bridges cannot rotate or slide, enhancing the reliability of the bridges.

Preferably, the bridges and the brackets are connected through rivets. The hinges formed by rivet connection have higher reliability and are more convenient for setting.

A backlight module, comprising: a backplane, PCBs and locking pieces for fixing the PCBs to the backplane. The backplane comprises a frame formed by a plurality of brackets, and bridges which are arranged on the brackets and used for fixing the PCBs; the bridges can rotate relative to the fixed points of the bridges to the brackets; the bridges are provided with chutes or through holes used for installing hillocks; the locking pieces are installed on the chutes or through holes; the PCBs are locked to the backplane through the locking pieces.

In the present invention, because the backplane is formed into a frame structure through a plurality of brackets and the frame is provided with the bridges used for installing components such as PCBs and the like, both of the brackets and the bridges can be formed by combining universal shaping pieces; the manufacturing cost is lower and a large number of materials are saved. Simultaneously, the bridges can rotate relative to the fixed points of the bridges to the brackets, so that the positions of hillocks on the bridges can be adjusted to satisfy the needs of the PCBs of different dimensions and enhance the universality of the backplane. Further, the bridges are provided with chutes used for installing the hillocks and the hillocks can be installed in corresponding positions in the chutes as required; and then, the hillocks can obtain horizontal and vertical adjustment; therefore, the setting points of the hillocks are increased; the hillocks can adapt to PCBs of more dimensions and have preferable universality.

BRIEF DESCRIPTION OF FIGURES

FIG. 15 is a structural diagram of to third hillock of the example of the present invention;
Wherein: 1. backplane; 100. frame; 111. upper bracket; 112. right bracket; 113. lower bracket; 114. left bracket; 115. central bracket; 120. bridge; 121. chute; 122. through hole; 124. end hinge; 125. tail hinge; 126. installing cross groove; 127. connecting groove; 800. hillock; 810. threaded hole; 811. screw; 812. nut; 820. rivet; 300. PCB.

DETAILED DESCRIPTION

Figure 2:
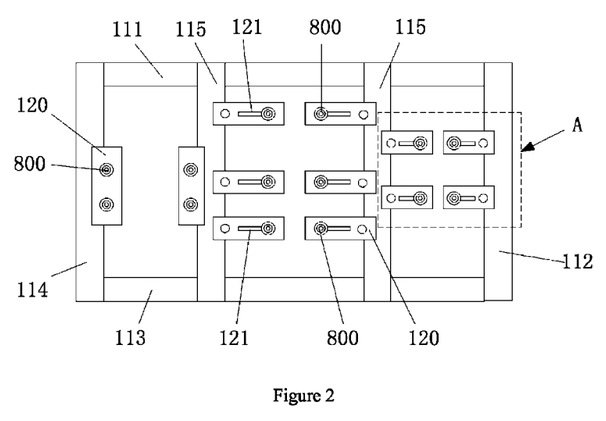
FIG. 2 is a first example of the present invention.

The present invention provides an LCD device, comprising: an LCD panel and a backlight module, wherein the bottom of the backlight module is provided with a backplane. The backplane comprises a frame formed by a plurality of brackets; the frame is provided with a plurality of bridges. As shown in FIG. 2, the brackets comprise an upper bracket 111, a lower bracket 113, a left bracket 114 and a right bracket 112 which are placed end to end to form a large frame of the whole backplane; the large frame is internally provided with two central brackets 115; both ends of the central brackets 115 are respectively fixed to the upper and the lower brackets. A plurality of bridges are arranged on each bracket and between two brackets; the bridges 120 can be used for fixing the PCBs and other components of the backlight module. The bridges can rotate relative to the fixed points of the bridges to the brackets; the bridges 120 are provided with hillocks 800 used for locking the PCBs, and chutes or through holes used for installing the hillocks.

Figure 3:
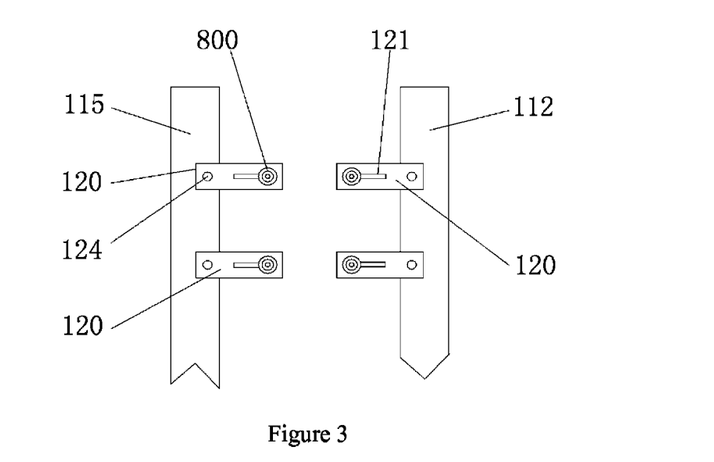
FIG. 3 is a partial enlarged view of A in FIG. 2.
Figure 4:
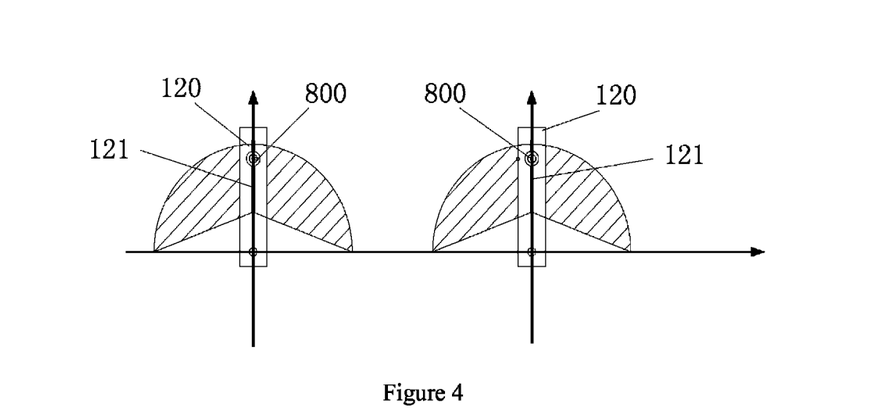
FIG. 4 is a trajectory analysis diagram of hillocks in a first example of the present invention.

For the scheme, the present invention will further be described in detail in accordance with the preferred examples of the bridges of the backplane provided with chutes:

FIG. 2 shows a first example of the present invention; FIG. 3 shows an enlarged view of A in FIG. 2; the central brackets 115 and the right bracket 112 are provided with totally four bridges 120 arranged in opposite sides; the fixed ends of the bridges 120 are respectively connected with the central brackets 115 and the right bracket 112 through the end hinges 124; in this way, the bridges 120 can rotate relative to the fixed points of the bridges 120 to the brackets (i.e. the end hinges 124). The bridges 120 are provided with chutes 121 and the chutes 121 are provided with hillocks 800 existing as individual parts; the hillocks 800 can be arranged in the corresponding positions on the chutes 121 as required. FIG. 4 shows an analysis of the mobile positions of the hillocks 800; shaded portions as shown in the figure (i.e. gradient-filled parts) are the mobile regions of the hillocks 800. Namely, with the rotation of the bridges 120 and the movement of the hillocks 800 on the chutes 121, the setting positions of the hillocks 800 are the regions of the shaded portions as shown in the figure; in this way, the corresponding rotating positions of the bridges 120 and the length of the chutes 121 are set according to the PCBs of different dimensions so that the shaded portions cover the locking points of various PCBs and the backplane can adapt to PCBs of various dimensions.

Figure 5:
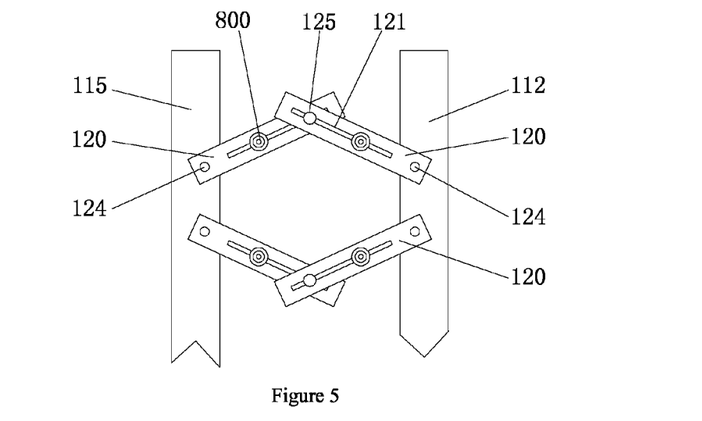
FIG. 5 is another structural form of a first example of the present invention.

In addition, to improve the supporting strength of the bridges, the free ends of two opposite bridges shall be connected and connecting grooves shall be arranged for installing the hinges so that the bridges still can rotate. As shown in FIG. 5, to facilitate processing, when the chutes 121 are processed, the length of the chutes 121 is extended so that the chutes 121 replace the connecting grooves for functions.

Figure 6:
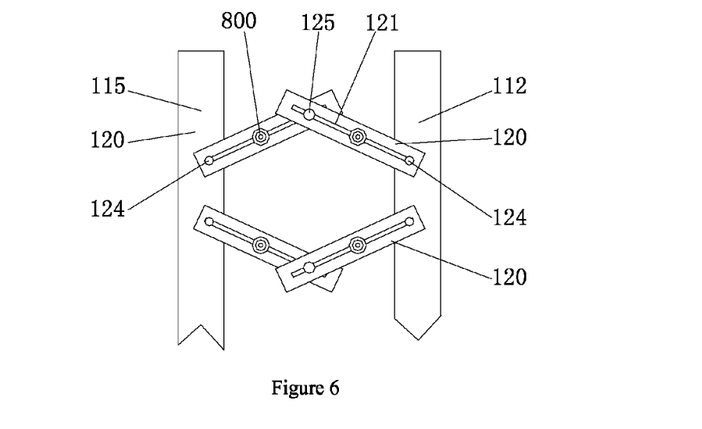
FIG. 6 is a third structural form of a first example of the present invention.

Certainly, the end hinges on the fixed ends can also be provided with corresponding installing cross grooves so that the bridges can slide relative to the end hinges; the installing cross grooves can also be processed in processing the chutes, namely the chutes replace the cross grooves for functions; as shown in FIG. 6, the chutes 121 extend to the connecting positions of the fixed ends.

Figure 7:
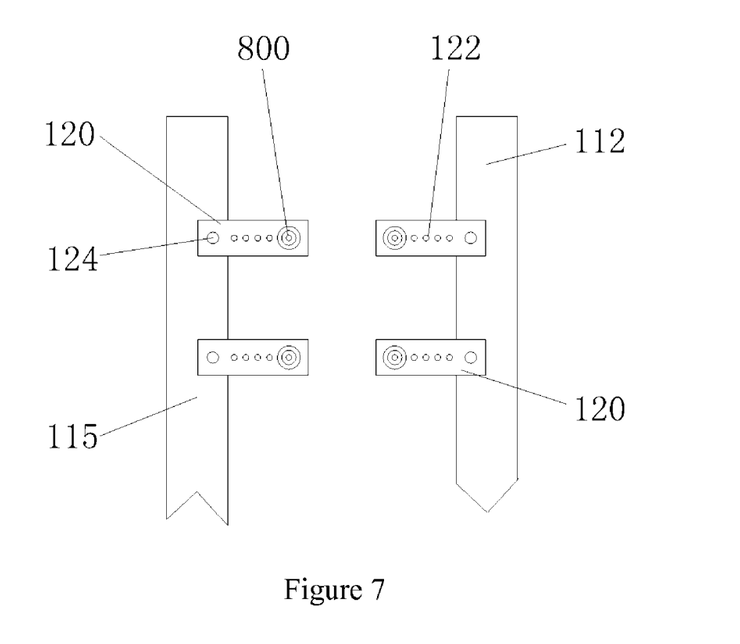
FIG. 7 is a second example of the present invention.
Figure 8:
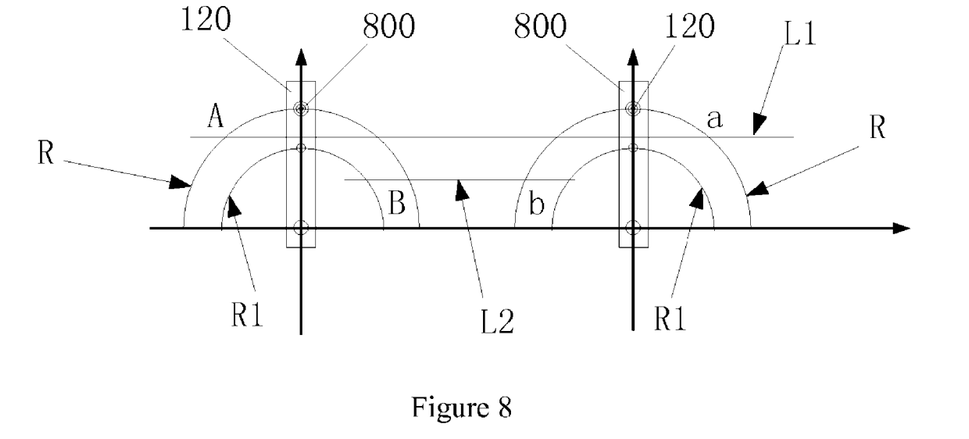
FIG. 8 is a trajectory analysis diagram of hillocks of a second example of the present invention.

FIG. 7 shows a second example of the present invention; the difference between the second example and the first example is in that the bridges 120 are provided with through holes 122 which are provided with hillocks 800 existing as individual parts, and the hillocks 800 can be arranged on the through holes 122 of the corresponding positions as required. FIG. 8 shows the analysis of the mobile positions of the hillocks 800; circular arcs R in the figure indicate the mobile tracks of the hillocks 800 on the through hole 122 of a certain position; the circular arcs R1 indicate the mobile tracks of the hillocks 800 on the through hole 122 of another position; similarly, different mobile tracks will be generated when the hillocks 800 are on the through holes 122 of different positions. In this way, by arranging the through holes 122 on the bridges 120, larger mobile tracks of the hillocks 800 can be obtained, namely the corresponding rotating positions of the bridges 120 and the positions and the number of the through holes 122 are set according to PCBs of different dimensions so that the mobile tracks of the hillocks 800 cover the locking points of various PCBs and the backplane can adapt to PCBs of various dimensions.

Figure 9:
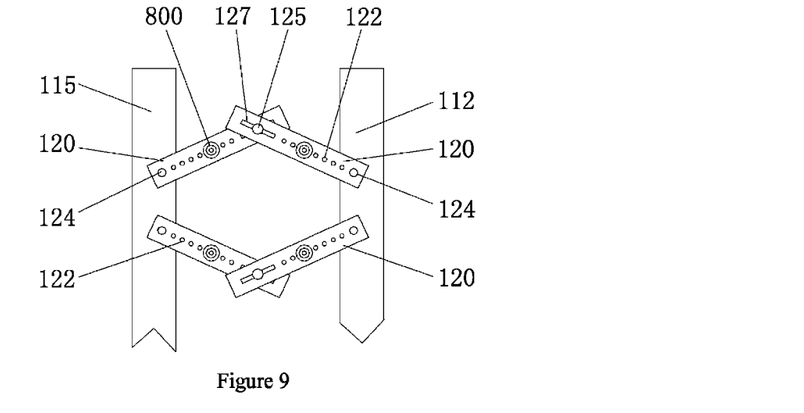
FIG. 9 is another structural form of a second example of the present invention.
Figure 10:
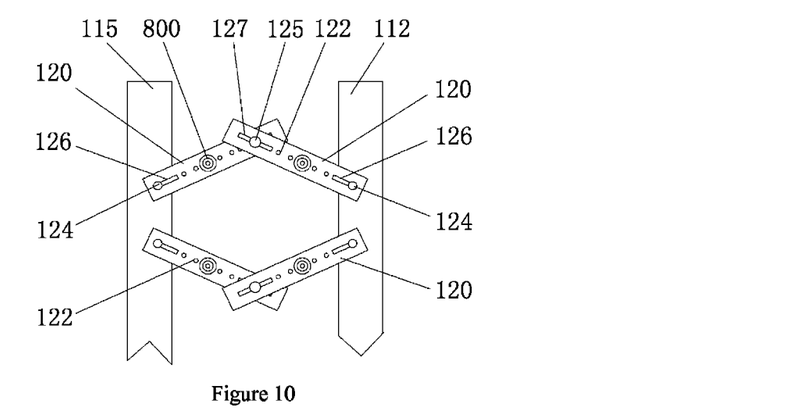
FIG. 10 is a third structural form of a second example of the present invention.

As shown in FIG. 9, similar to the second example, to improve the supporting strength of the bridges 120, the free ends of two opposite bridges 120 shall be connected and connecting grooves 127 shall be arranged for installing the tail hinges 125 so that the bridges still can rotate. As shown in FIG. 10, the end hinges 124 on the fixed ends can also be provided with corresponding installing cross grooves 126 so that the bridges can slide relative to the end hinges for obtaining better mobile regions of the hillocks.

In the two examples of the present invention, the hinge connection among the bridges and the brackets and among the bridges can be connected through screws or rivets; the screws can be locked in the screw mode after finishing locking the PCBs, improving the stability of the screws; the connecting reliability can be improved by using the rivets.

Figure 11:
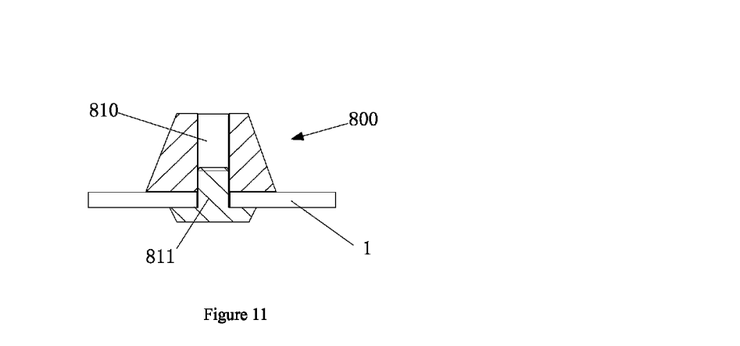
FIG. 11 is a structural diagram of a hillock of the example of the present invention.
Figures 12, 13:
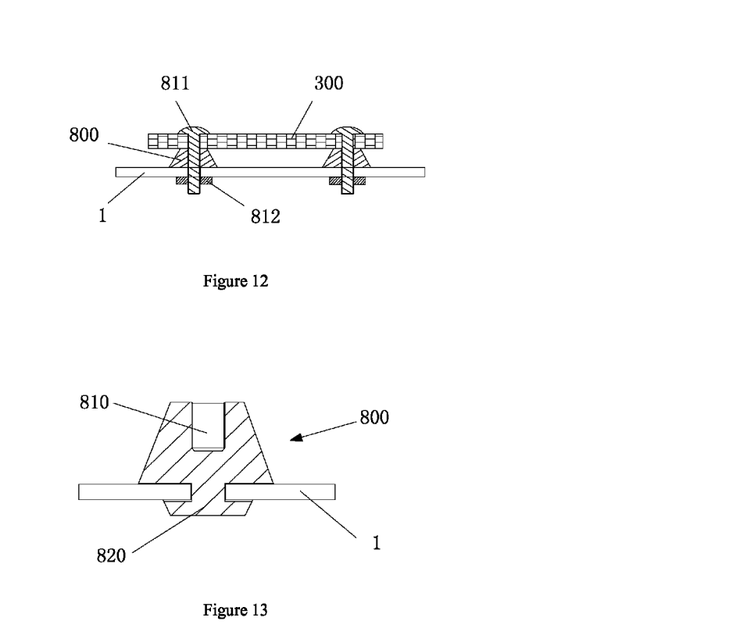
FIG. 12 is a structural diagram of locking PCBs through hillocks in the example of the present invention.
FIG. 13 is a structural diagram of another hillock of the example of the present invention.

FIGS. 11 and 13 show the hillocks 800 existing as independent parts in the example of the present invention; the hillocks 800 are not formed on the backplane in producing the backplane but installed in the corresponding positions of the backplane 1 when the hillocks needs to be used so as to achieve the purpose of flexibly using the hillocks 800 to locate the components of PCBs of various dimensions and the like.

As shown in FIG. 11, the hillock 800 is provided with a threaded hole 810 used for installing and fixing the components of PCBs and the like; the threaded hole 810 penetrates through the independent hillock 800 so that the independent hillock 800 can be fixed to the backplane 1 from below through a screw 811; at the same time, the PCBs can be fixed from above; correspondingly, the backplane 1 shall be provided with hillock installing holes with the equivalent size to the threaded holes 810 of the hillock 800, such as through holes or chutes, so that the hillock 800 can be fixed to the backplane 1. Similarly, only one screw can be used for matching a nut to achieve the fixation among the PCB, the hillock and the backplane; as shown in FIG. 12, because the threaded hole penetrates through the whole hillock 800, only one screw 811 can be matched with the nut 812 for directly locking the PCB 300 to the backplane 1.

Figure 14:
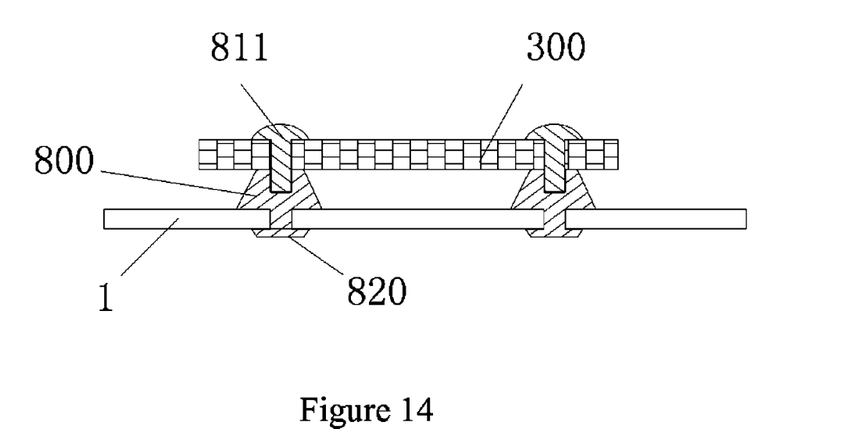
FIG. 14 is a structural diagram of locking PCBs through another hillocks in the example of the present invention.

To facilitate installation, as shown in FIG. 13, the bottom of the hillock can be set into a similar structure to a rivet, namely the rivet and the hillock are integrally formed; the connection of the lower part of the hillock 800 with the backplane 1 is in a riveting form, namely the hillock 800 is riveted to the backplane 1 through the rivet 820. The riveting mode is quicker than the screwed connection mode, can be finished through a machine, and improves the production efficiency. As shown in FIG. 14, the hillock 800 is fixed to the backplane 1 through the rivet 820; then, the PCB 300 is fixed to the hillock through the screw 811 for finishing locking the PCB 300.

Figure 15:
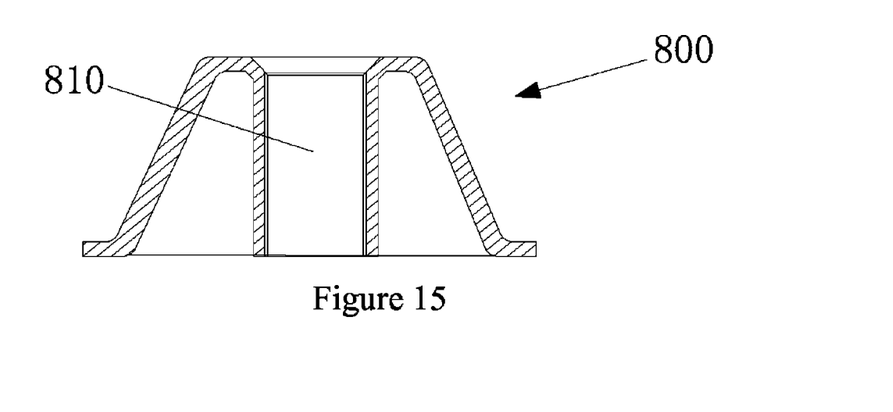

To save the material and facilitate processing, the hillock can be formed by directly stamping a plate; as shown in FIG. 15, the inner part of the hillock 800 is a hollow structure and the whole hillock 800 is made of a plate material, thus the material is saved and the production is convenient.

Certainly, the shape of the independent hillock 800 in the example is not limited to the conical section shape as shown in the figure; the corresponding purpose can also be achieved relative to other shapes such as a square.

In the example, the corresponding hillocks are arranged in the corresponding positions according to the dimensions of the PCBs in the backlight module; simultaneously, the number of corresponding hillocks is set according to PCB components of different numbers.

The present invention is described in detail in accordance with the above contents with the specific preferred examples. However, this invention is not limited to the specific examples. For the ordinary technical personnel of the technical field of the present invention, on the premise of keeping the conception of the present invention, the technical personnel can also make simple deductions or replacements, and all of which should be considered to belong to the protection scope of the present invention.

We claim:

1. A backplane, comprising: a frame formed by a plurality of brackets, and bridges which are arranged on said brackets and used for fixing PCBs; said bridges can rotate relative to fixed points of the bridges to said brackets; said bridges are provided with chutes or through holes used for installing hillocks;
   wherein said bridges are arranged on two adjacent or opposite brackets in pairs; fixed ends of said bridges are connected to the brackets through end hinges;
   wherein the free ends of said two bridges arranged in pairs are connected through the tail hinges; space between the hinging point of the said free ends and said fixed point is adjustable.

2. The backplane of claim 1, wherein said PCBs are supported through at least four bridges arranged on said brackets.

3. The backplane of claim 1, wherein the free ends of said two bridges arranged in pairs are provided with connecting grooves; said tail hinges penetrate through said connecting grooves of the two bridges; said tail hinges can slide in said connecting grooves.

4. The backplane of claim 1, wherein the free ends of said two bridges arranged in pairs are provided with connecting grooves; said fixed ends arranged in pairs are also provided with installing cross grooves; said end hinges and said tail hinges respectively slide in said connecting grooves and said installing cross grooves.

5. The backplane of claim 1, wherein chutes of said two bridges extend to the tails of the free ends; said tail hinges penetrate through said chutes.

6. The backplane of claim 1, wherein chutes of said two bridges extend to the end parts of the free ends and end parts of the fixed ends; said tail hinges penetrate through said chutes.

7. The backplane of claim 1, wherein, said bridges and said brackets are connected through screws.

8. The backplane of claim 1, wherein said bridges and said brackets are connected through rivets.

9. A backlight module, comprising: a backplane, PCBs and locking pieces used for fixing the PCBs to the backplane; said backplane comprises a frame formed by a plurality of brackets, and bridges which are arranged on said brackets and used for fixing the PCBs; said bridges can rotate relative to fixed points of the bridges to said brackets; said bridges are provided with chutes or through holes used for installing hillocks; said locking pieces are installed on said chutes or through holes; said PCBs are locked to the backplane through said locking pieces;
   wherein said bridges are arranged on two adjacent or opposite brackets in pairs; fixed ends of said bridges are connected to the brackets through the end hinges;
   wherein, the free ends of said two bridges arranged in pairs are connected through the tail hinges; space between the hinging point of the free ends and said fixed point is adjustable.

10. The backlight module of claim 9, wherein said PCBs are supported through at least four bridges arranged on said brackets.

11. The backlight module of claim 9, wherein the free ends of said two bridges arranged in pairs are provided with connecting grooves; said tail hinges penetrate through the connecting grooves of said two bridges; said tail hinges can slide in said connecting grooves.

12. The backlight module of claim 9, wherein the free ends of said two bridges arranged in pairs are provided with connecting grooves; said fixed ends arranged in pairs are also provided with installing cross grooves; said end hinges and said tail hinges respectively slide in said connecting grooves and said installing cross grooves.

13. The backplane module of claim 9, wherein chutes of said two bridges extend to the end parts of the free ends; said tail hinges penetrate through said chutes.

14. The backplane module of claim 9, wherein chutes of said two bridges extend to the end parts of the free ends and the end parts of the fixed ends; said tail hinges penetrate through said chutes.

15. The backlight module of claim 9, wherein said bridges and said brackets are connected through screws.

16. The backlight module of claim 9, wherein said bridges and said brackets are connected through rivets.

* * * * *